United States Patent
Liao (10) Patent No.: US 7,810,019 B2
(45) Date of Patent: Oct. 5, 2010

(54) DYNAMIC POWER ADJUSTING DEVICE FOR VITERBI DECODER

(75) Inventor: Ting-Ko Liao, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 950 days.

(21) Appl. No.: 11/646,313

(22) Filed: Dec. 28, 2006

(65) Prior Publication Data

US 2007/0277081 A1  Nov. 29, 2007

(30) Foreign Application Priority Data

May 25, 2006  (TW) .............................. 95118528 A (51) Int. Cl.
*H03M 13/03* (2006.01)
(52) U.S. Cl. ...................... 714/795; 714/794
(58) Field of Classification Search ................. 714/795, 714/794
See application file for complete search history.

(56) References Cited

U.S. PATENT DOCUMENTS

| | | | |
|---|---|---|---|
| 6,081,296 A * | 6/2000 | Fukunaga et al. ...... 375/240.12 |
| 6,163,581 A | 12/2000 | Kang |
| 6,337,890 B1 | 1/2002 | Maru |
| 6,615,388 B1 | 9/2003 | Takamichi |
| 6,637,003 B1 * | 10/2003 | Hori et al. .................. 714/795 |
| 6,731,691 B2 * | 5/2004 | Agazzi et al. ............... 375/285 |
| 6,738,419 B2 * | 5/2004 | Agazzi et al. ............... 375/232 |
| 6,771,725 B2 * | 8/2004 | Agazzi et al. ............... 375/355 |
| 6,778,602 B2 * | 8/2004 | Agazzi et al. ............... 375/233 |
| 6,807,228 B2 * | 10/2004 | Agazzi et al. ............... 375/232 |
| 7,369,608 B2 * | 5/2008 | Agazzi et al. ............... 375/232 |
| 7,453,935 B2 * | 11/2008 | Agazzi et al. ............... 375/233 |
| 7,689,888 B2 * | 3/2010 | Kan et al. .................... 714/758 |

OTHER PUBLICATIONS

Black et al., "A 140-Mb/s, 32-state, radix-4 Viterbi decoder," IEEE Journal of Solid-State Circuits, vol. 27, Issue 12, Dec. 1992, pp. 1877-1885, ISSN: 0018-9200, INSPEC Assession No. 4338291, Abstract only provided.
Ishitani et al., "A scarce-state-transition Viterbi-decoder VLSI for bit error correction," IEEE Journal of Solid-State Circuits, vol. 22, Issue 4, Aug. 1987, pp. 575-582, ISSN: 0018-9200, Abstract only provided.

* cited by examiner

*Primary Examiner*—Joseph D Torres
(74) *Attorney, Agent, or Firm*—Birch, Stewart, Kolasch & Birch, LLP (57) ABSTRACT

A dynamic power adjusting device for a Viterbi decoder is disclosed. The device includes a processing unit for receiving a plurality of data to be decoded, detecting whether the data to be decoded have any bit errors, and estimating a number of the bit errors of the data. The device further includes a control unit for receiving the bit errors and the number of the bit errors of the data detected by the processing unit, so as to enable the Viterbi decoder to perform decoding, and disable the Viterbi decoder after the Viterbi decoder has performed the decoding the number of times equivalent to the number of the bit errors. By way of the dynamic adjustment technique, coupled with the bit-error detection and estimation, workload of the Viterbi decoder in operation is capable of being adjusted according to bit error rate (BER) such that less power is consumed in a decoding process.

6 Claims, 7 Drawing Sheets

DYNAMIC POWER ADJUSTING DEVICE FOR VITERBI DECODER

BACKGROUND OF THE INVENTION

1. Field of the Invention

The present invention relates to communication decoding devices and, more particularly, to a dynamic power adjusting device for use in a Viterbi decoder, for bit-error detection and number of bit-error estimation and dynamic power adjustment.

2. Description of the Prior Art

Combination of wireless communications and the broadband Internet is an inevitable trend of telecommunications. In the field of wireless communications, a channel is always required for data transmission. Channels as such are susceptible to interference from ambient thermal noise and, to a greater extent, electromagnetic interference, such as repeated reflection and diffraction.

In view of the aforesaid problem, the past decades saw the emergence of many communication related notions and methods, of which an important one is about forward error correction (FEC). Forward error correction is based on an error-controlling code widely used in digital communications—a sender sends out redundant bit-containing data, and a receiver detects an error by combinational features of the data received and automatically corrects the error. Among the existing forward error correction techniques, convolutional coding is a predominant one.

Convolutional coding, a major form of channel coding, is characterized by a variety of convolutional codes, depending on system specifications, for example, a wireless local area network (WLAN) and the third generation (3G) mobile communications. Convolutional coding entails the following: performing specific conversion on input digital signals by a memory-enabled sequential circuit, generating output digital signals having metric values and transmitted in a certain sequence, and correcting bit errors, caused to digital signals transmitted in a channel and corrupted as a result of noise, interference and attenuation, by a decoder at the receiving end in accordance with the metric values and sequence embodied in the signals. Among the decoders available for convolutional coding, Viterbi decoder is the best one. A typical Viterbi decoder, whose hardware requirements are relatively simple, comprises four major units, namely a branch metric unit, an add-compare-select unit, a path metric unit, and a trace back unit, in a chronological order.

Figure 1:
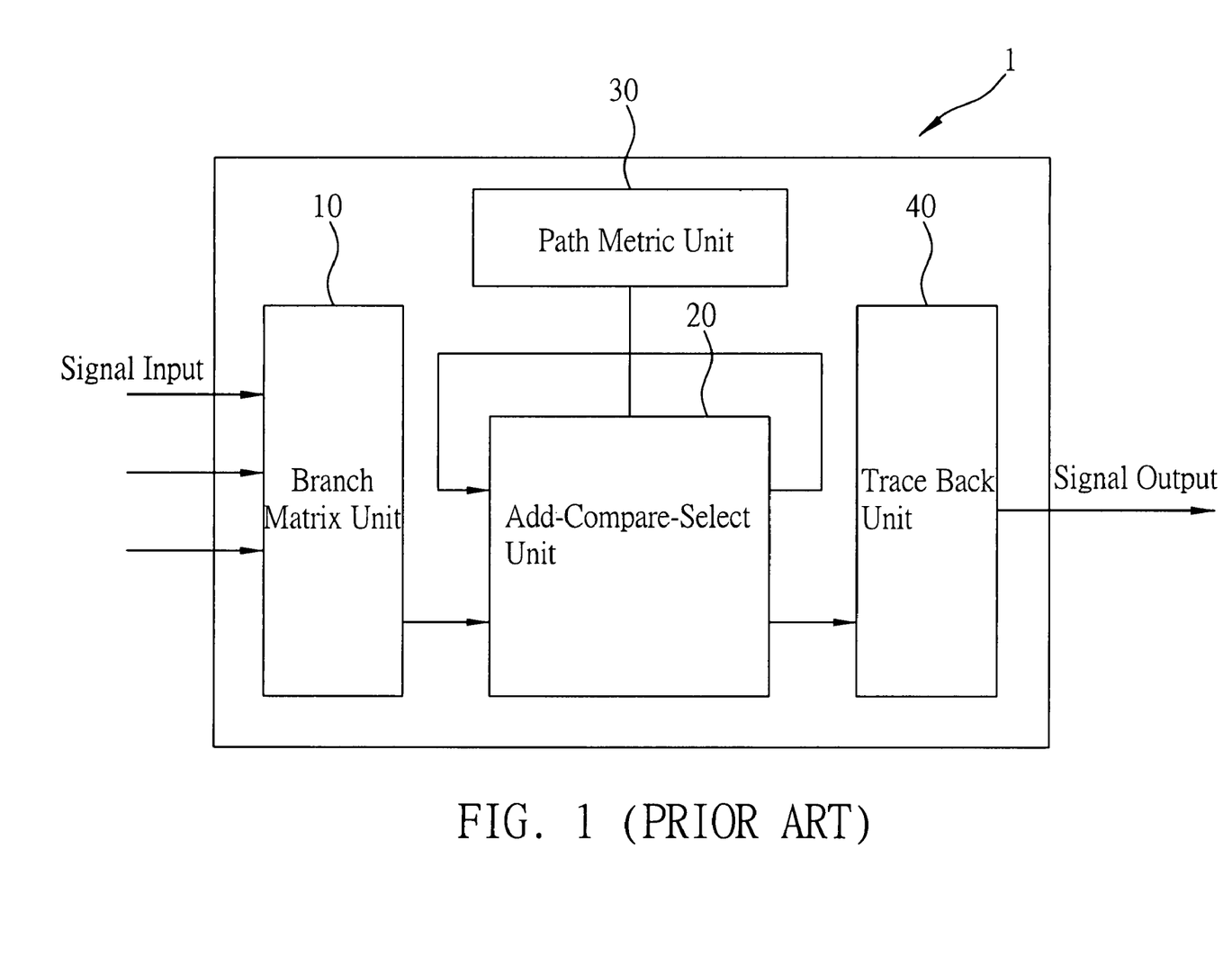
FIG. 1 (PRIOR ART) is a block diagram of the structure of a conventional Viterbi decoder.

A conventional Viterbi decoder is always designed to suit a specific type of convolutional code. Hence, the four major units of the conventional Viterbi decoder, namely the branch metric unit, the add-compare-select unit, the path metric unit, and the trace back unit, are designed in light of the known parameters of the intended convolutional code, such as constraint length and generator polynomials. Referring to FIG. 1, which is a block diagram of the structure of a conventional Viterbi decoder 1. A branch matrix unit 10 receives a plurality of data to be decoded. Computation is performed on the data received and to be decoded, using a state matrix corresponding to a convolutional code. A branch metric value is outputted to an add-compare-select unit 20. An add-compare-select operation is performed on the branch metric value and a path matrix previously stored in a path metric unit 30 with a view to generating a new path matrix. The new path matrix is sent to the path metric unit 30 for storage. A trace back unit 40 selects a small path matrix in accordance with a value generated as a result of the operation performed by the add-compare-select unit 20. Trace back computation is performed, so as to output a decoded single bit.

Figure 2A:
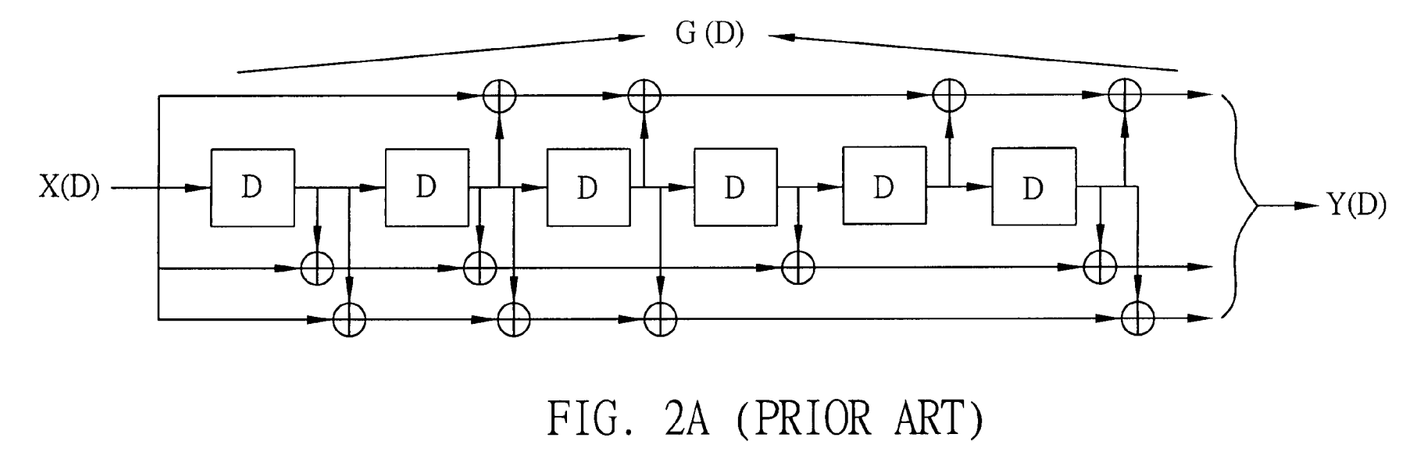
FIG. 2A (PRIOR ART) is a schematic view of the operation of a coding polynomial of a conventional Viterbi decoder.
Figure 2B:
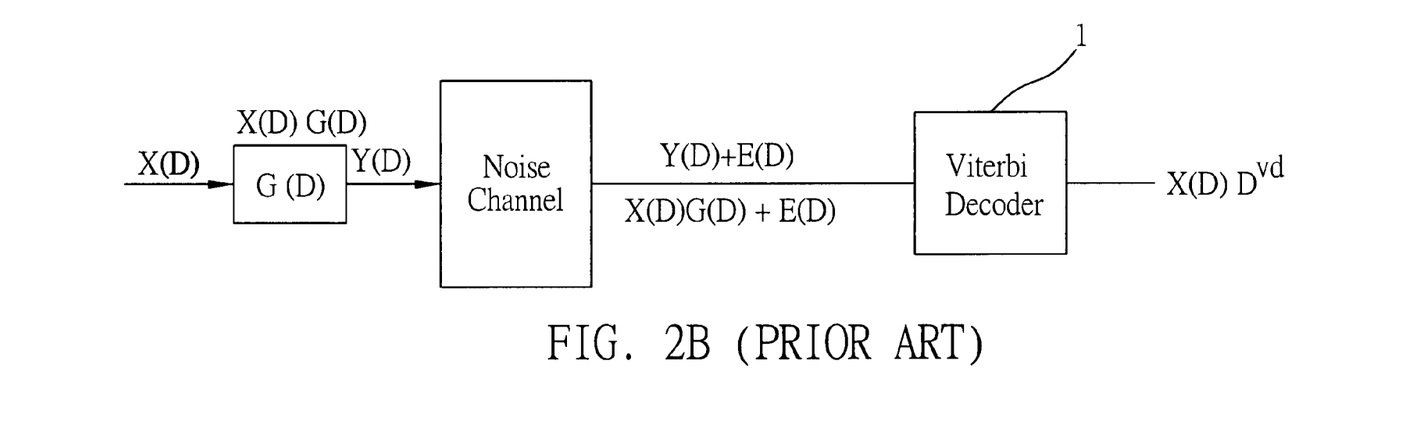
FIG. 2B (PRIOR ART) is a schematic view of the operation of a conventional Viterbi decoder.

Referring to FIGS. 2A and 2B, which are schematic views showing the operation of a conventional Viterbi decoder, where X(D) denotes a source signal, the source signal X(D) is encoded by a coding polynomial G(D). As shown in FIG. 2A, with the coding polynomial $G(D)=[1+D^2+D^3+D^5+D^61+D+D^2+D^4+D^61+D+D^2+D^3+D^6]$, the source signal X(D) is encoded to yield an encoded signal Y(D). Then, the encoded signal Y(D) passes through a noisy channel and produces an erroneous signal E(D). Finally, both the encoded signal Y(D) and the erroneous signal E(D) undergo Viterbi decoding to recover the delayed source signal.

Figure 3:
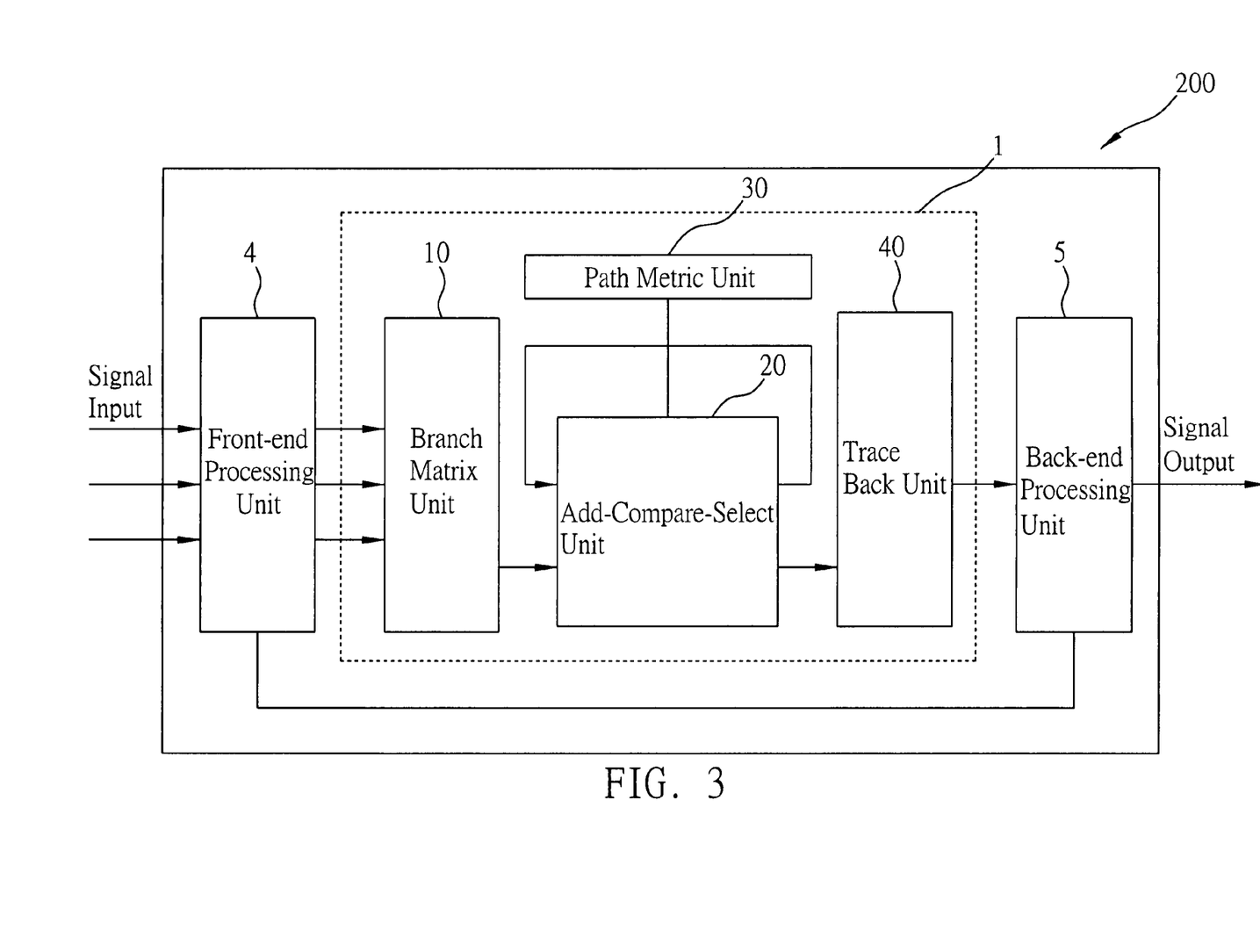
FIG. 3 is a block diagram of the structure of a SST Viterbi decoder.

Nevertheless, a conventional Viterbi decoder consumes the same amount of power, whether bit error-containing signals are zero biased or not. Hence, a scarce-state-transition (SST) Viterbi decoder was developed with a view to solving the aforesaid problem. As shown in FIG. 3, a SST Viterbi decoder 200 differs from a conventional decoder 1 in that the SST Viterbi decoder 200 comprises a front-end processing unit 4 and a back-end processing unit 5. The front-end processing unit 4 generates a bit error-containing signal after receiving a plurality of data to be decoded, reduces variation of signals entering the conventional Viterbi decoder 1 because of zero biased bit error-containing signals, reduces power consumed for variation of signals of an inbuilt processing unit, sends the bit error-containing signal to the conventional Viterbi decoder 1 for decoding. Eventually, the back-end processing unit 5 outputs a decoded signal.

Figure 4:
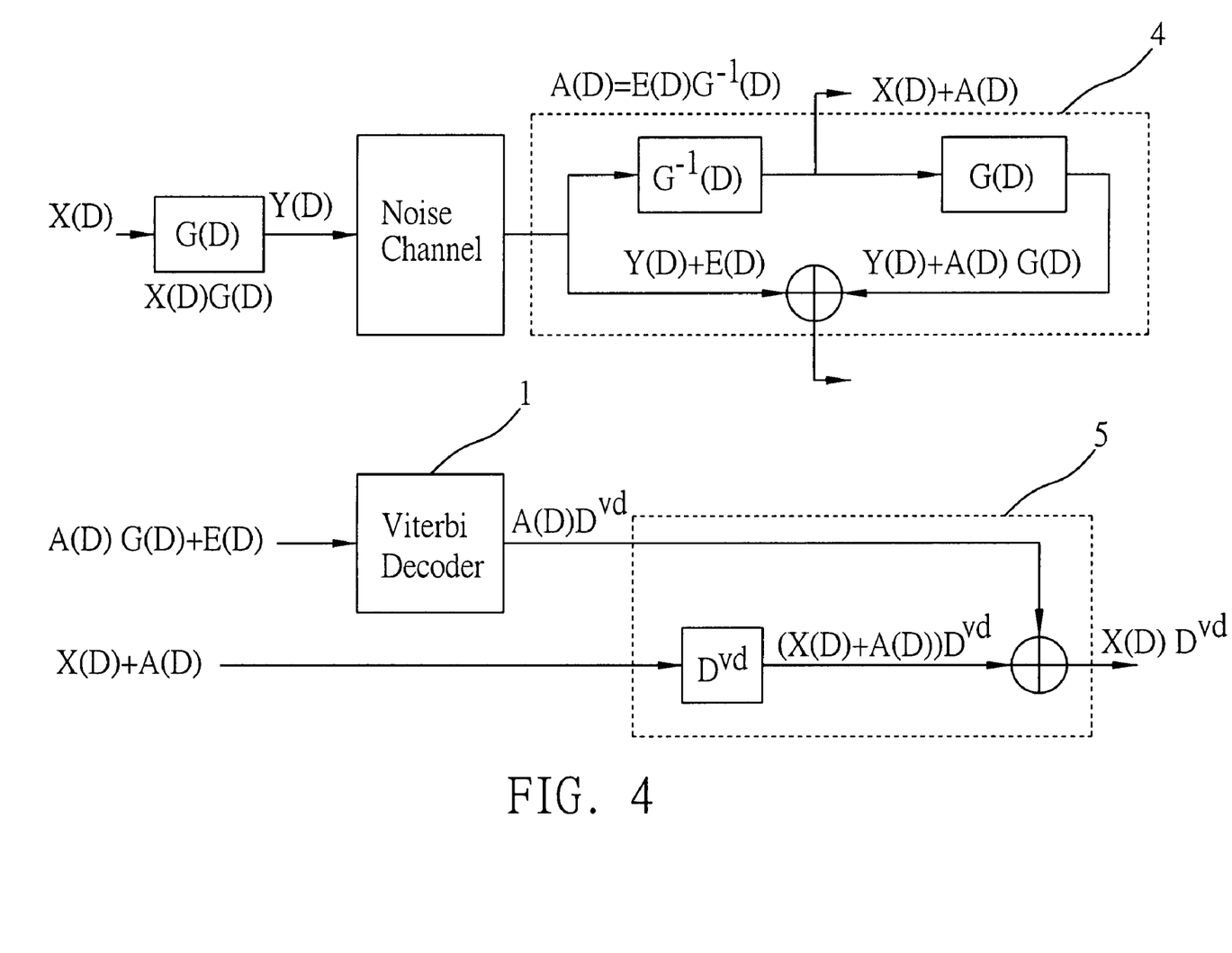
FIG. 4 is a schematic view of the operation of a SST Viterbi decoder.

Referring to FIG. 4, which is a schematic view showing the operation of a SST Viterbi decoder. As shown in the drawing, the source signal X(D) is encoded by a coding polynomial G(D) so as to generate an encoded signal Y(D), and then the encoded signal Y(D) passes through a noisy channel so as to generate an erroneous signal E(D). Both the encoded signal Y(D) and the erroneous signal E(D) are transformed by an anti-matrix $G^{-1}(D)$ of the front-end processing unit 4 so as to obtain a polynomial $X(D)+E(D)G^{-1}(D)$ whereby the bit error-containing signal is zero biased. Then, the polynomial $X(D)+E(D)G^{-1}(D)$ processed signal is sent to the back-end processing unit 5 to generate $(X(D)+A(D))D^{vd}$ after a delay time $D^{vd}$. The polynomial $X(D)+E(D)G^{-1}(D)$ is transformed by a matrix G(D) so as to obtain $Y(D)+A(D)G(D)$, where A(D) equals $E(D)G^{-1}(D)$. An exclusive OR (XOR) gate operation is performed between $Y(D)+A(D)G(D)$ and the $Y(D)+E(D)$ generated because of encoding and passing through the noisy channel, so as to generate an erroneous signal, as expressed in $A(D)G(D)+E(D)$, and send the erroneous signal to the conventional Viterbi decoder. Then, the erroneous signal enters the back-end processing unit 5 and undergoes an operation of $(X(D)+A(D))D^{vd}$ as a result of transformation by the anti-matrix $G^{-1}(D)$, so as to generate a delayed source signal $X(D)D^{vd}$.

With a zero biased bit error-containing signal, the SST Viterbi decoder 200 reduces variation of signals entering the conventional Viterbi decoder 1. However, the SST Viterbi decoder 200 reduces variation of processing-related, rather than clock-related, signals, and thus the reduction of power consumption is quite limited. Besides, it is a flip flop and a clock buffer tree which account for most of the power consumed by the conventional Viterbi decoder. Hence, strictly speaking, the SST Viterbi decoder 200 fails to achieve power saving through a zero biased bit error-containing signal.

Accordingly, an issue calling for urgent solution involves reducing power consumption dynamically during a communication decoding process.

SUMMARY OF THE INVENTION

In light of the aforesaid drawbacks of the prior art, it is a primary objective of the present invention to provide a dynamic power adjusting device for use in a viterbi decoder so as to perform decoding rapidly.

Another objective of the present invention is to provide a dynamic power adjusting device for use in a viterbi decoder so as to adjust power dynamically.

Yet another objective of the present invention is to provide a dynamic power adjusting device for use in a viterbi decoder so as to be power-saving dynamically.

In order to achieve the above and other objectives, the present invention provides a dynamic power adjusting device for use in a viterbi decoder. The viterbi decoder comprises a branch matrix unit, an add-compare-select unit, a path metric unit, and a trace back unit. The dynamic power adjusting device has a processing unit and a control unit. The processing unit receives a plurality of data to be decoded, detects whether the data to be decoded have any bit errors, and estimates a number of the bit errors of the data to be decoded. The control unit is configured to receive the bit errors and the number of the bit errors of the data, so as to enables the Viterbi decoder to perform decoding, and disable the Viterbi decoder after the Viterbi decoder has performed the decoding the number of times corresponding to the number of the bit errors.

The branch matrix unit performs, according to a state matrix corresponding to a convolutional code, computation on the bit errors and the number of the bit errors detected by the processing unit, so as to generate a branch metric value. The add-compare-select unit performs an add-compare-select operation on the branch metric value and a path matrix previously stored in the path metric unit, generates a new path matrix, and sends the new path matrix back to the path metric unit for storage. The trace back unit selects a small path matrix in accordance with a value generated as a result of the operation performed by the add-compare-select unit, performs trace back computation, and outputs a decoded single bit.

The processing unit is not only capable of zero-biasing bit error-containing signals but also comprises a sliding window. The Viterbi decoder is enabled/disabled in the presence/absence of bit errors within the sliding window.

The processing unit further comprises a wave filtering controller for detecting the generation of a bit error-containing signal Accordingly, a dynamic power adjusting device for use in a Viterbi decoder in accordance with the present invention has the following features. In the event that a bit error of an input signal to be decoded is found in a sliding window of a processing unit, the bit error-containing input signal will be sent to a control unit which will then enable a Viterbi decoder and output the bit error-containing signal to the Viterbi decoder for decoding, and eventually the control unit will output a decoded signal. In the event that no bit error is found in the sliding window, the control unit will be informed of this, and the control unit will disable the Viterbi decoder and receive a fast decoding signal, and eventually a decoded signal is outputted.

In the present invention, since a bit error-containing signal is zero biased, the bit error rate (BER) is low; hence, the chance of discovering any bit error within a sliding window of a processing unit is relatively small, which means that the chance of a control unit disabling a Viterbi decoder is relatively great. Furthermore, rapid decoding consumes less power than Viterbi decoding. Therefore, the present invention allows decoding to be power-saving.

DETAILED DESCRIPTION OF THE PREFERRED EMBODIMENTS

The following specific embodiments are provided to illustrate the present invention. Others skilled in the art can readily gain an insight into other advantages and features of the present invention based on the contents disclosed in this specification. The present invention can also be performed or applied in accordance with other different embodiments. Various modifications and changes based on different viewpoints and applications yet still within the scope of the present invention can be made in the details of the specification.

Figure 5:
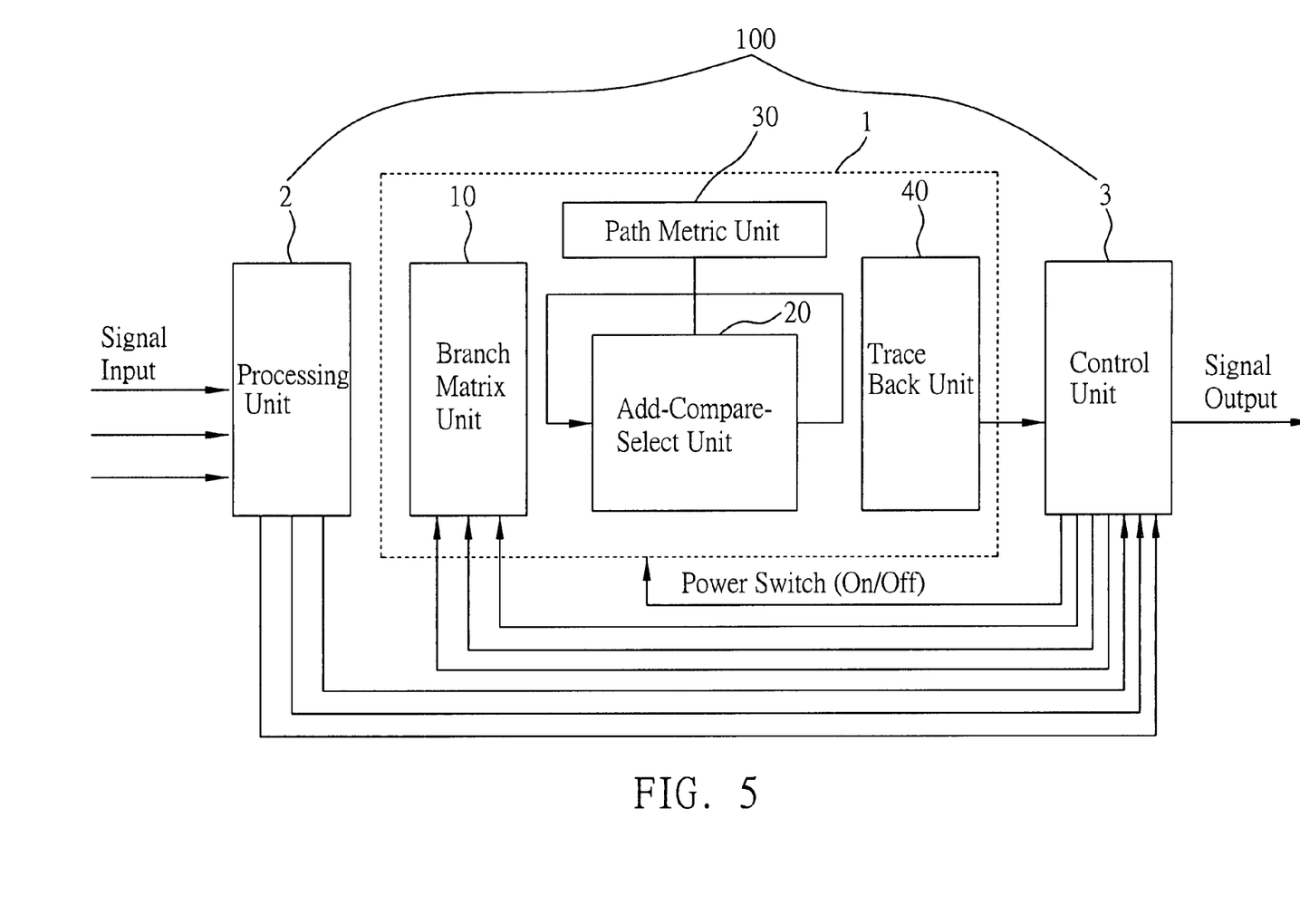
FIG. 5 is a block diagram of the structure of a dynamic power adjusting device for use in a Viterbi decoder in accordance with the present invention.

Referring to FIG. 5, which is a block diagram of the structure of a dynamic power adjusting device 100 for use in a Viterbi decoder in accordance with the present invention, the Viterbi decoder 1 comprises a branch matrix unit 10, an add-compare-select unit 20, a path metric unit 30, and a trace back unit 40, whereas the dynamic power adjusting device 100 comprises a processing unit 2 and a control unit 3.

The processing unit 2 receives a plurality of data to be decoded, detects whether the data to be decoded have any bit errors, and estimates a number of the bit errors of the data to be decoded.

The branch matrix unit 10 performs, according to a state matrix corresponding to a convolutional code, computation on the bit errors and the number of the bit errors detected and estimated by the processing unit 2, so as to generate a branch metric value.

The add-compare-select unit 20 receives a branch metric value generated by the branch matrix unit 10, performs an add-compare-select operation on the branch metric value and a path matrix previously stored in the path metric unit 30, generates a new path matrix, and sends the new path matrix back to the path metric unit 30 for storage.

The trace back unit 40 selects a small path matrix in accordance with a value generated as a result of the operation performed by the add-compare-select unit 20, performs trace back computation, and outputs a decoded single bit.

Configured for dynamic control of power supply, the control unit 3 receives the bit errors, which are detected and estimated by the processing unit 2, of the data to be decoded, so as to enable the Viterbi decoder 1 to perform decoding upon detection of the presence of the bit errors, and disconnect the Viterbi decoder 1 from a power supply after the Viterbi decoder 1 has performed the decoding the number of times equivalent to the number of the bit errors.

Figure 6:
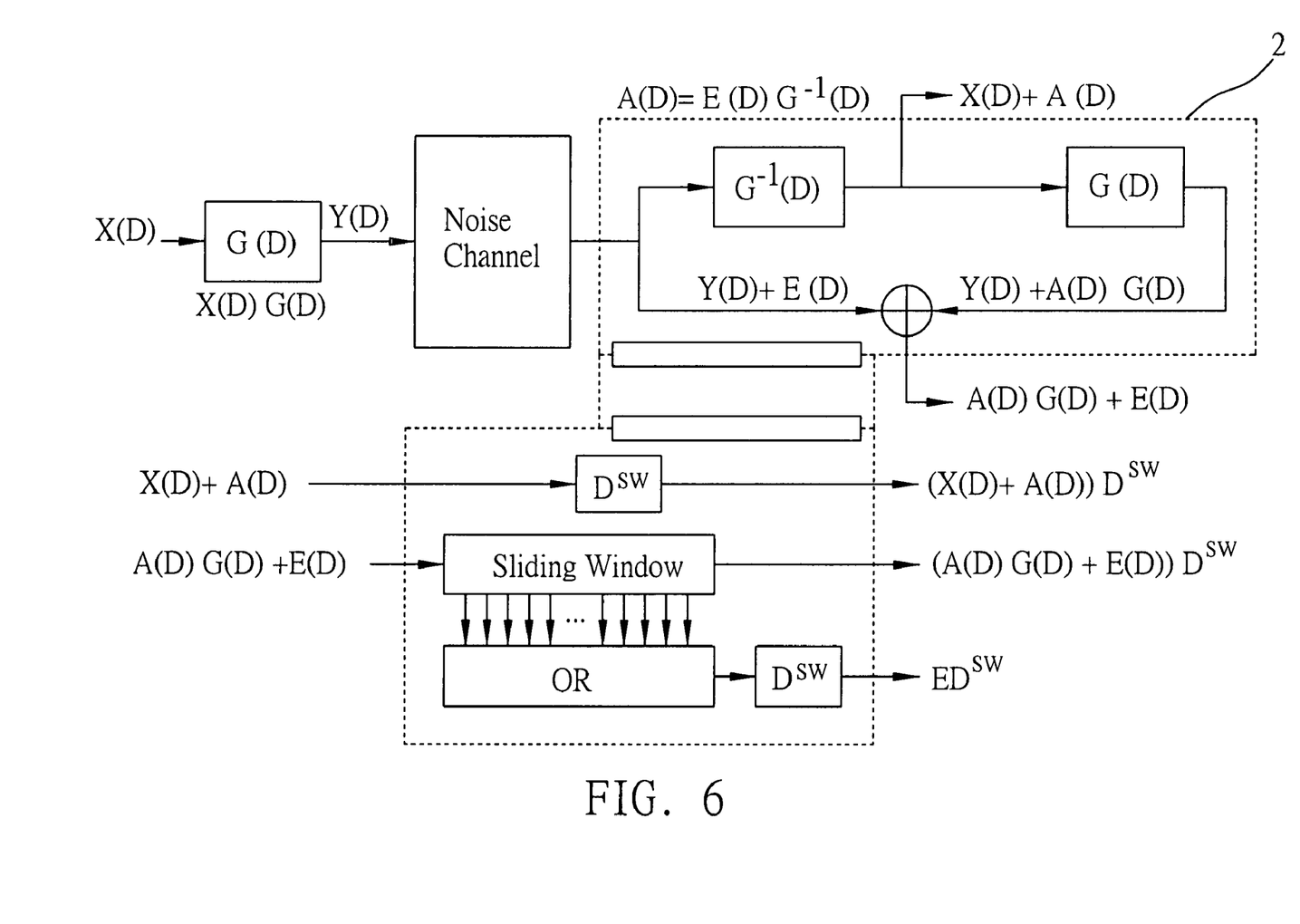
FIG. 6 is a schematic view of the operation of a processing unit of a dynamic power adjusting device for use in a Viterbi decoder in accordance with the present invention.

Referring to FIG. 6, which is a schematic view showing how to calculate the values of the bit errors detected and estimated by the processing unit of FIG. 5, the source signal X(D) is encoded by a coding polynomial G(D) so as to generate an encoded signal Y(D), and then the encoded signal Y(D) passes through a noisy channel so as to generate an erroneous signal E(D). Both the encoded signal Y(D) and the erroneous signal E(D) are transformed by an anti-matrix $G^{-1}$(D) of the processing unit 2 so as to obtain a polynomial X(D)+E(D)$G^{-1}$(D) whereby the bit error-containing signal is zero biased. After a delay time $D^{sw}$, the polynomial X(D)+E(D)$G^{-1}$(D) processed signal becomes (X(D)+A(D))$D^{sw}$ and is sent to the control unit 3. The polynomial X(D)+E(D)$G^{-1}$(D) is transformed by a matrix G(D) so as to obtain Y(D)+A(D)G(D), where A(D) equals E(D)$G^{-1}$(D). An exclusive OR (XOR) gate operation is performed between Y(D)+A(D)G(D) and the Y(D)+E(D) generated because of encoding and passing through the noisy channel, so as to generate an erroneous signal, as expressed in A(D)G(D)+E(D). The erroneous signal A(D)G(D)+E(D) is delayed by a sliding window and yields a (A(D)G(D)+E(D))$D^{sw}$ which is then sent to the control unit 3. A bit signal detected in the sliding window undergoes an OR gate operation and a delay to yield an error detection signal $ED^{sw}$ which is then sent to the control unit 3.

Figure 7:
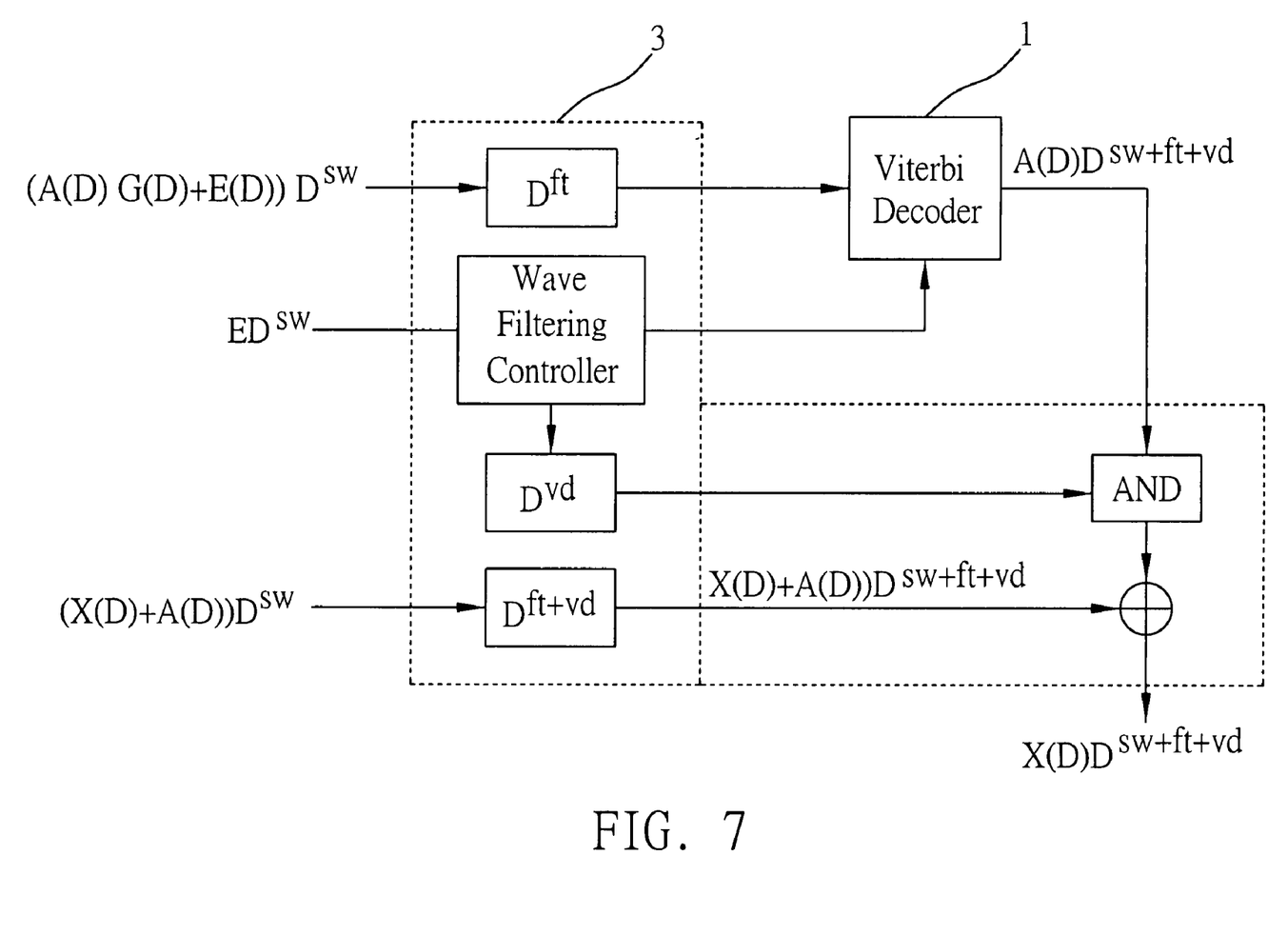
FIG. 7 is a schematic view of the operation of a control unit of a dynamic power adjusting device for use in a Viterbi decoder in accordance with the present invention.

Referring to FIG. 7, which is a schematic view showing the operation of the control unit of FIG. 5, a result of an operation performed by the processing unit 2 on (A(D)G(D)+E(D))$D^{sw}$ is sent to the control unit 3, and then sent to the conventional Viterbi decoder 1 after a delay time $D^{ft}$, and thus a delayed signal A(D)$D^{sw+ft+vd}$ is derived. At that point, the error detection signal $ED^{sw}$ at the control unit 3 is detected by a wave filtering controller for a bit error-containing signal before being sent to the conventional Viterbi decoder 1, to determine whether the conventional Viterbi decoder 1 is to be enabled. The error detection signal $ED^{sw}$ received by the wave filtering controller undergoes an AND gate operation in conjunction with the signal A(D)$D^{sw+ft+vd}$ after a delay time $D^{vd}$, and then undergoes an exclusive OR (XOR) gate operation in conjunction with a signal (X(D)+A(D))$D^{sw+ft+vd}$ delayed by a time $D^{ft+vd}$, so as to recover the source signal X(D)$D^{sw+ft+vd}$ delayed by a certain time.

The dynamic power adjusting device 100 for use in a Viterbi decoder 1 in accordance with the present invention has the following features. In the event that a bit error of an input signal to be decoded is found in a sliding window of the processing unit 2, the bit error-containing input signal will be sent to a control unit 3 which will then enable the Viterbi decoder 1 and output the bit error-containing signal to the Viterbi decoder 1 for decoding, and eventually the control unit 3 will output a decoded signal. In the event that no bit error is found in the sliding window, the control unit 3 will be informed of this, and the control unit 3 will disable the Viterbi decoder 1 and receive a fast decoding signal, and eventually a decoded signal is outputted. In the present invention, since a bit error-containing signal is zero biased, the bit error rate (BER) is low; hence, the chance of discovering any bit error within a sliding window of a processing unit is relatively small, which means that the chance of a control unit disabling a Viterbi decoder is relatively great. Furthermore, rapid decoding consumes less power than Viterbi decoding. Therefore, the present invention allows decoding to be power-saving.

The aforesaid embodiments merely serve as the preferred embodiments of the present invention. They should not be construed as to limit the scope of the present invention in any way. Hence, any other changes can actually be made in the present invention. It will be apparent to those skilled in the art that all equivalent modifications or changes made, without departing from the spirit and the technical concepts disclosed by the present invention, should fall within the scope of the appended claims.

What is claimed is:

1. A dynamic power adjusting device for use in a Viterbi decoder, the Viterbi decoder comprising a branch matrix unit, an add-compare-select unit, a path metric unit, and a trace back unit, the device comprising:
   a processing unit for receiving a plurality of data to be decoded, detecting whether the data to be decoded have any bit errors, and estimating a number of the bit errors of the data to be decoded; and
   a control unit for receiving the bit errors and the number of the bit errors detected by the processing unit, enabling the Viterbi decoder to perform decoding, and disabling the Viterbi decoder after the Viterbi decoder has performed the decoding a number of times equivalent to the number of the bit errors.

2. The device of claim 1, wherein the branch matrix unit performs according to a state matrix corresponding to a convolutional code computation on the bit errors and the number of the bit errors detected by the processing unit so as to generate a branch metric value, the add-compare-selection unit performs an add-compare-selection operation on the branch metric value and a path matrix previously stored in the path metric unit so as to generate a new path matrix and then send the new path matrix back to the path metric unit for storage, and wherein the trace back unit selects a small path matrix in accordance with a value generated as a result of the operation performed by the add-compare-select unit and performs trace back computation so as to output a decoded single bit.

3. The device of claim 1, wherein the processing unit is capable of zero-biasing bit error-containing signals.

4. The device of claim 3, wherein the processing unit comprises a sliding window such that the Viterbi decoder is enabled/disabled in the presence/absence of the bit errors within the sliding window.

5. The device of claim 1, wherein the processing unit comprises a sliding window such that the Viterbi decoder is enabled/disabled in the presence/absence of the bit errors within the sliding window.

6. The device of claim 1, wherein the processing unit comprises a wave filtering controller for detecting generation of a bit error-containing signal.

* * * * *